(12) United States Patent
Kawasaki

(10) Patent No.: US 8,159,027 B2
(45) Date of Patent: Apr. 17, 2012

(54) SEMICONDUCTOR DEVICE

(75) Inventor: Hisao Kawasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 12/511,461

(22) Filed: Jul. 29, 2009

(65) Prior Publication Data

US 2010/0059800 A1    Mar. 11, 2010

(30) Foreign Application Priority Data

Sep. 9, 2008   (JP) .................................. 2008-230962

(51) Int. Cl.
    *H01L 29/66*    (2006.01)
(52) U.S. Cl. .................. 257/340; 438/302; 257/E21.428
(58) Field of Classification Search .................. 257/340, 257/E21.428; 438/302
    See application file for complete search history.

(56) References Cited

U.S. PATENT DOCUMENTS

| | | | | |
|---|---|---|---|---|
| 5,891,783 A | * | 4/1999 | Lin et al. ........................ | 438/302 |
| 5,955,759 A | * | 9/1999 | Ismail et al. .................... | 257/332 |
| 7,528,443 B2 | * | 5/2009 | Kunii et al. .................... | 257/340 |
| 7,625,789 B2 | * | 12/2009 | Aihara ........................... | 438/182 |
| 2003/0132463 A1 | | 7/2003 | Miyoshi | |
| 2006/0115938 A1 | * | 6/2006 | Wu et al. ....................... | 438/182 |

FOREIGN PATENT DOCUMENTS

| | | |
|---|---|---|
| JP | 10-135239 | 5/1998 |
| JP | 2001-274377 | 10/2001 |
| JP | 2003-203930 | 7/2003 |
| JP | 2005-85961 | 3/2005 |
| JP | 2007-227885 | 9/2007 |

OTHER PUBLICATIONS

Office Action issued Dec. 7, 2010, in Japanese Patent Application No. 2008-230962 with partial English translation.

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

A semiconductor device including: a SiC substrate; an AlGaN layer formed on the SiC substrate; a source electrode and a drain electrode formed on the AlGaN layer so as to be spaced from each other; an insulation film formed between the source electrode and the drain electrode and having a band-like opening in parallel to the source electrode and the drain electrode; a gate electrode formed at the opening in the insulation film; and a drain-side field plate electrode formed integrally with the gate electrode on the drain electrode side of the gate electrode and having a drain electrode side end portion spaced from the insulation film, thus restraining degradation in performance.

5 Claims, 6 Drawing Sheets

SEMICONDUCTOR DEVICE

CROSS REFERENCE TO RELATED APPLICATIONS

This application is based upon and claims the benefit of priority from the prior Japanese Patent Application No. 2008-230962 filed in Japan on Sep. 9, 2008; the entire contents of which are incorporated herein by reference.

TECHNICAL FIELD

The present invention relates to a semiconductor device that operates in a high-frequency band and, in particular, to a field effect transistor using a nitride semiconductor and the like.

BACKGROUND ART

A field effect transistor (FET) using a compound semiconductor such as GaN has excellent high-frequency characteristics. Accordingly, the FET has been widely in practical use as a semiconductor device operating in a microwave band.

The FET has, for example, the following structure, as disclosed in Japanese Patent Application Laid-Open No. 2007-227885. On an operating layer formed on a semiconductor substrate, a rectangular source electrode and a rectangular drain electrode are formed, spaced from each other. Between the source electrode and the drain electrode, a band-like gate electrode is formed. On the operating layer, an insulating film is formed between the source electrode, the drain electrode and a gate electrode, respectively. A field plate electrode whose length on the source electrode side is short and whose length on the drain electrode side is long is formed on the gate electrode.

In the FET, the long field plate electrode is formed on the gate electrode on the drain electrode side. Hence, the potential at a drain side end portion of the gate electrode can be lowered. Thereby application of a high voltage to the FET is achieved. However, while the field plate electrode can lower the potential at the drain side end portion of the gate electrode as described above, an interval between the field plate electrode and the drain electrode becomes smaller, which increases the floating capacitance generated between the electrodes, and thus phenomena such as oscillation and a gain drop are likely to occur. That is, the floating capacitance is a possible cause of degradation in FET performance. Accordingly, it is very important to form the field plate electrode in such a manner as to suppress the increase in the floating capacitance.

As a method for forming a field plate electrode so as to control an increase in floating capacitance, the following method is known, as disclosed in Japanese Patent Application Laid-Open No. 10-135239. The method is for integrally forming a gate electrode and a gate field plate electrode of a semiconductor device by means of metal vapor-deposition using a resist layer having an overhang opening.

By thus performing the metal vapor deposition using a resist layer having an overhang opening, the metal vapor-deposited at the opening portion and the metal vapor-deposited on a resist layer can be spaced from each other. Hence the excessive metal vapor-deposited on the resist layer can also be removed when removing the resist layer. Accordingly, no excessive metal will remain on the field plate electrode, thus forming a field plate electrode while suppressing an increase in floating capacitance.

However, in performing metal vapor deposition using a resist layer having an overhang-shaped opening in this way, deposited metal components diagonally incident to the opening and metal deposited at the opening may flow through a gap between an end portion of the field plate electrode and a side wall of the opening in the resist layer, which generates a thin trailing portion at the end portion of the field plate electrode. Accordingly, it has conventionally been difficult to suppress an increase in floating capacitance due to the trailing portion, which causes a problem of degradation in performance of the device.

SUMMARY

According to an embodiment of the present invention, there is provided a semiconductor device including : a semiconductor substrate; an operating layer formed on the semiconductor substrate; a source electrode and a drain electrode formed on the operating layer so as to be spaced from each other; an insulation film formed between the source electrode and the drain electrode and having a band-like opening in parallel to the source electrode and the drain electrode; a gate electrode formed at the opening in the insulation film; and a drain-side field plate electrode formed integrally with the gate electrode on the drain electrode side of the gate electrode and having a drain electrode side end portion spaced from the insulation film.

According to an embodiment of the manufacturing method for the present invention, there is provided a manufacturing method for a semiconductor device including the steps of: forming an operating layer on a semiconductor substrate; forming a source electrode and a drain electrode on the operating layer so as to be spaced from each other; forming, between the source electrode and the drain electrode, an insulation film having a band-like first opening in parallel to the electrodes; forming a first resist layer on the insulation film, wherein the first resist layer has a second opening above the first opening, and wherein the second opening has a larger opening area than that of the first opening and is of a tapered shape in cross section; forming a second resist layer on the first resist layer, wherein the second resist layer has a third opening above the second opening, and wherein the third opening has a larger opening area than that of the second opening and is of an overhang shape in cross section; integrally forming a gate electrode, a drain-side field plate electrode and a source-side field plate electrode by vapor-depositing metal from above the second resist layer having the third opening; and removing the first resist layer and the second resist layer after the metal vapor deposition.

DETAILED DESCRIPTION

An embodiment of the present invention will be described below with reference to the accompanying drawings.

Figure 1A:
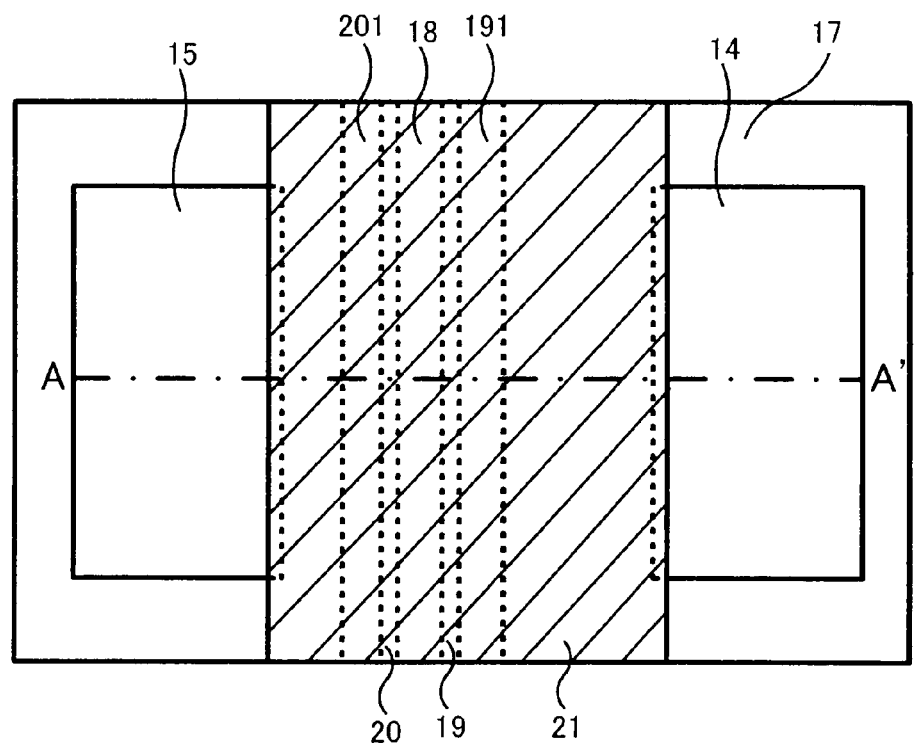
FIG. 1A is a top view illustrating a structure of a semiconductor device according to an embodiment of the present invention.
Figure 1B:
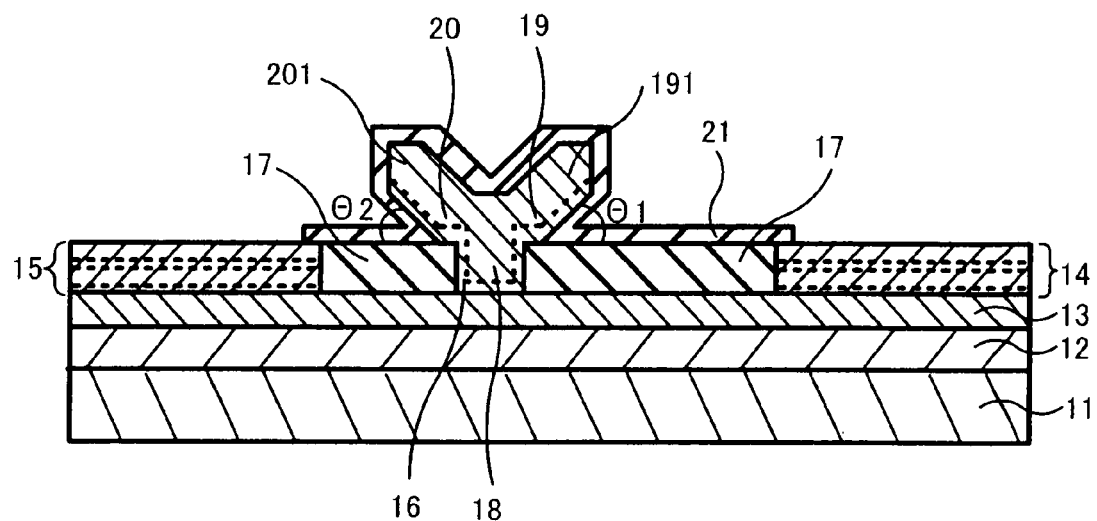
FIG. 1B is a sectional view taken along a broken line A-A' of FIG. 1A.

FIG. 1A is a top view illustrating a semiconductor device according to an embodiment of the present invention and FIG. 1B is a sectional view taken along a broken line A-A' of FIG. 1A.

As illustrated in FIG. 1B, the semiconductor device presented in the present embodiment has a GaN buffer layer 12 on a SiC substrate 11. On the GaN buffer layer 12, there is formed an AlGaN layer 13 as an operating layer.

On the AlGaN layer 13, a rectangular drain electrode 14 and a rectangular source electrode 15, which respectively form an ohmic contact with the AlGaN layer 13, are formed so as to be spaced from each other. The drain electrode 14 and the source electrode 15 are composed of, for example, alloy in which Ti, Al, Ni and Au are laminated in this order.

A thickness of respective films in the alloy forming the drain electrode 14 and the source electrode 15 is, for example, Ti=20 nm, Al=200 nm, Ni=50 nm and Au=200 nm.

As illustrated in FIG. 1A, on the AlGaN layer 13, an insulation film 17 is formed such that the drain electrode 14 and the source electrode 15 are exposed. The insulation film 17 has a band-like first opening 16 between the drain electrode 14 and the source electrode 15, as shown in FIG. 1B. In the first opening 16, a band-like gate electrode 18 is formed. The gate electrode 18 is composed of, for example, alloy in which Ni and Au are laminated in this order, and has Schottky contact at a position in contact with the AlGaN layer 13.

A thickness of respective films in the alloy forming the gate electrode 18 is, for example, Ni=50 nm and Au=500 nm.

In the semiconductor device according to the present embodiment, a drain-side field plate electrode 19 is formed on the insulation film 17 from a side portion of the gate electrode 18 toward the drain electrode 14 side, as illustrated in FIG. 1B. The drain-side field plate electrode 19 has an end portion 191 on the drain electrode 14 side, which is spaced from the insulation film 17. In this case, an angle θ1 between a surface of the insulation film 17 and the end portion 191 of the drain-side field plate electrode 19 is, for example, 60°.

Similarly, a source-side field plate electrode 20 is formed on the insulation film 17 from a side portion of the gate electrode 18 toward the source electrode 15 side. The source-side field plate electrode 20 has an end portion 201 on the source electrode 15 side, which is spaced from the insulation film 17. In this case, an angle θ2 between the surface of the insulation film 17 and the end portion 201 of the source-side field plate electrode 20 is, for example, 60°.

The field plate electrodes 19, 20 and the gate electrode 18 are integrally formed. Surfaces of the gate electrode 18 and the field plate electrodes 19, 20 are covered with a surface protective film 21.

Referring next to FIGS. 2 to 8, a manufacturing method for a semiconductor device according to the present embodiment will be described below.

Figure 2:
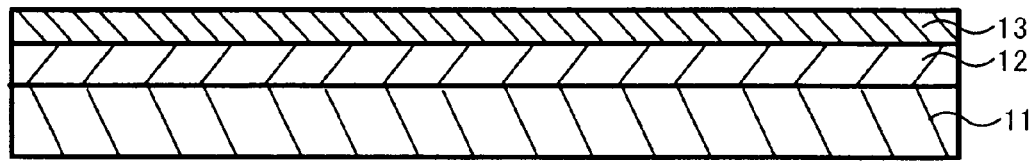
FIG. 2 is a sectional view illustrating a manufacturing process of a semiconductor device according to an embodiment of the present invention.

First, as illustrated in FIG. 2, the GaN buffer layer 12 is formed on the SiC substrate 11. Next, the AlGaN layer 13 is formed on the GaN buffer layer 12.

Figure 3:
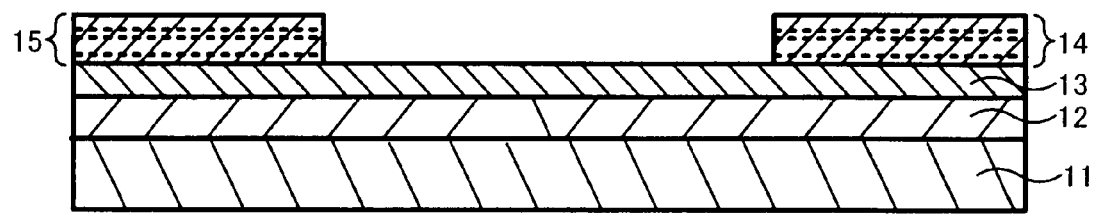
FIG. 3 is a sectional view illustrating a manufacturing process of a semiconductor device according to an embodiment of the present invention.

Subsequently, as illustrated in FIG. 3, the drain electrode 14 and the source electrode 15 are respectively formed on the AlGaN layer 13. The electrodes 14, 15 are formed by laminating, on the AlGaN layer 13, a resist layer having a rectangular opening at a position where each of the drain electrodes 14 and the source electrodes 15 illustrated in FIG. 1A is formed, vapor-depositing Ti, Al, Ni and Au, which are metal materials forming the drain electrode 14 and the source electrode 15, in this order from above the resist layer, and removing the resist layer after the vapor deposition.

Figure 4:
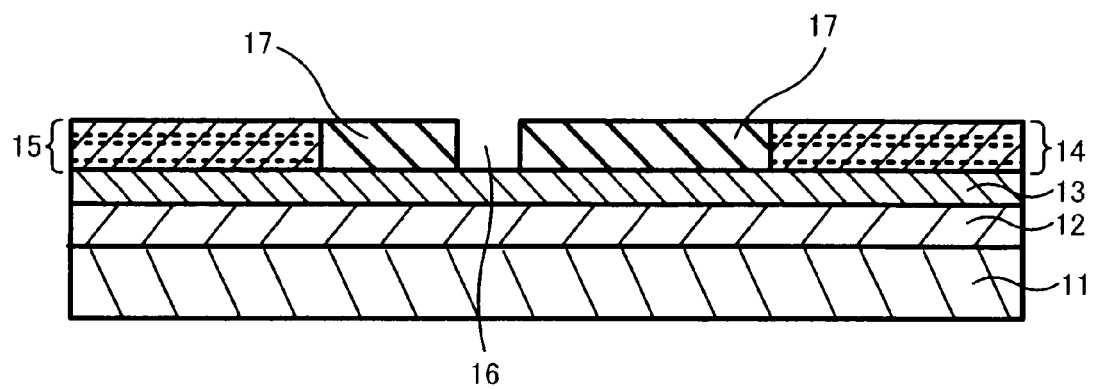
FIG. 4 is a sectional view illustrating a manufacturing process of a semiconductor device according to an embodiment of the present invention.

As illustrated in FIG. 4, the insulation film 17 having the band-like first opening 16 is then formed between the drain electrode 14 and the source electrode 15.

Figure 5:
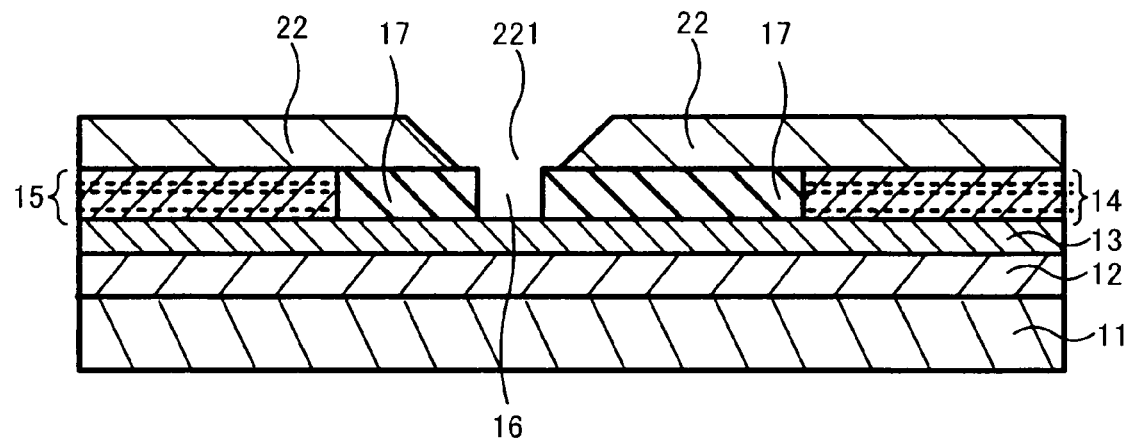
FIG. 5 is a sectional view illustrating a manufacturing process of a semiconductor device according to an embodiment of the present invention.

Next, as illustrated in FIG. 5, on the insulation film 17, the drain electrode 14 and the source electrode 15, there is formed a first resist layer 22 having a second opening 221 with an opening area widening from the lower portion toward the upper portion thereof and a tapered shape in cross section. In this process, the tapered second opening 221 is formed above the first opening 16 of the insulation film 17.

Figure 6A:
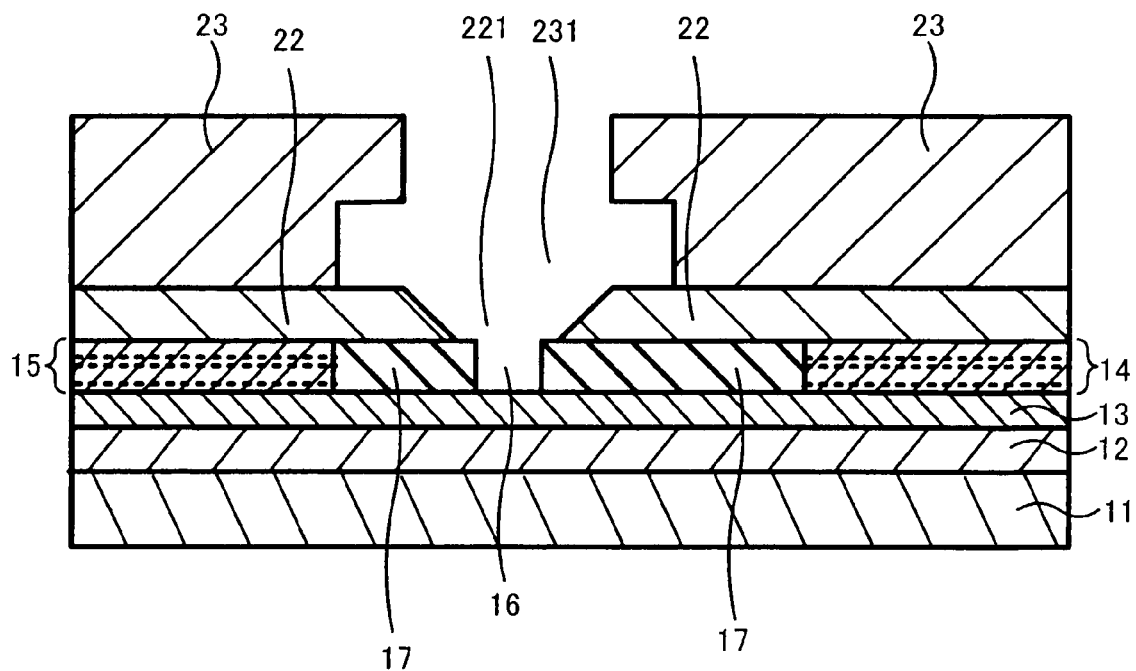
FIG. 6A is a sectional view illustrating a manufacturing process of a semiconductor device according to an embodiment of the present invention.

Subsequently, as illustrated in FIG. 6A, on the first resist layer 22, there is formed a second resist layer 23 having a third opening 231 of an overhang shape in cross section. The second resist layer 23 is, for example, a single-layered resist layer composed of a negative resist. The overhang-shaped third opening 231 is formed by, for example, forming a resist mask (not illustrated) on the single-layered resist layer and then immersing the mask into chemical. The overhang-shaped third opening 231 may be obtained using any other method.

Figure 6B:
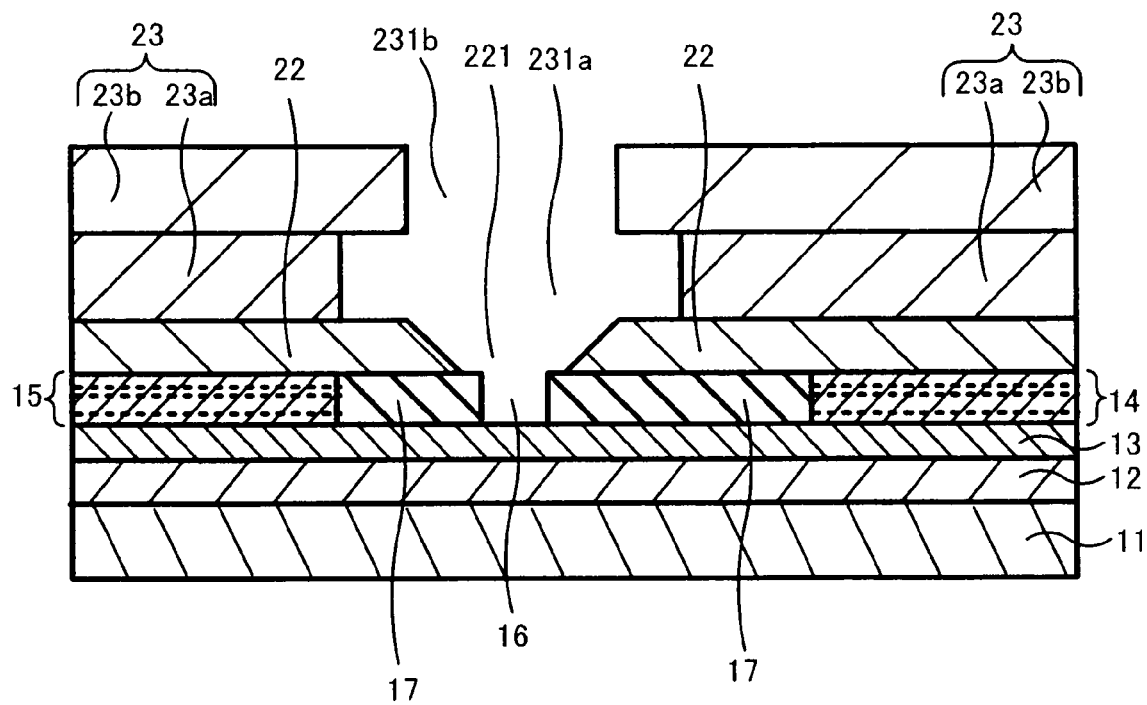
FIG. 6B is a sectional view illustrating a modified example of a manufacturing method for the semiconductor device illustrated in FIG. 6A.

However, the second resist layer 23, as illustrated in FIG. 6B, may be of a two-layered structure including a third resist layer 23a composed of a material which is easily developed and a fourth resist layer 23b composed of a material which is less easily developed than the resist layer 23a. In this case, the overhang-shaped third opening 231 illustrated in FIG. 6A includes a fourth opening 231a having a small opening area formed in the third resist layer 23a and a fifth opening 231b having a large opening area formed in the fourth resist layer 23b.

Figure 6C:
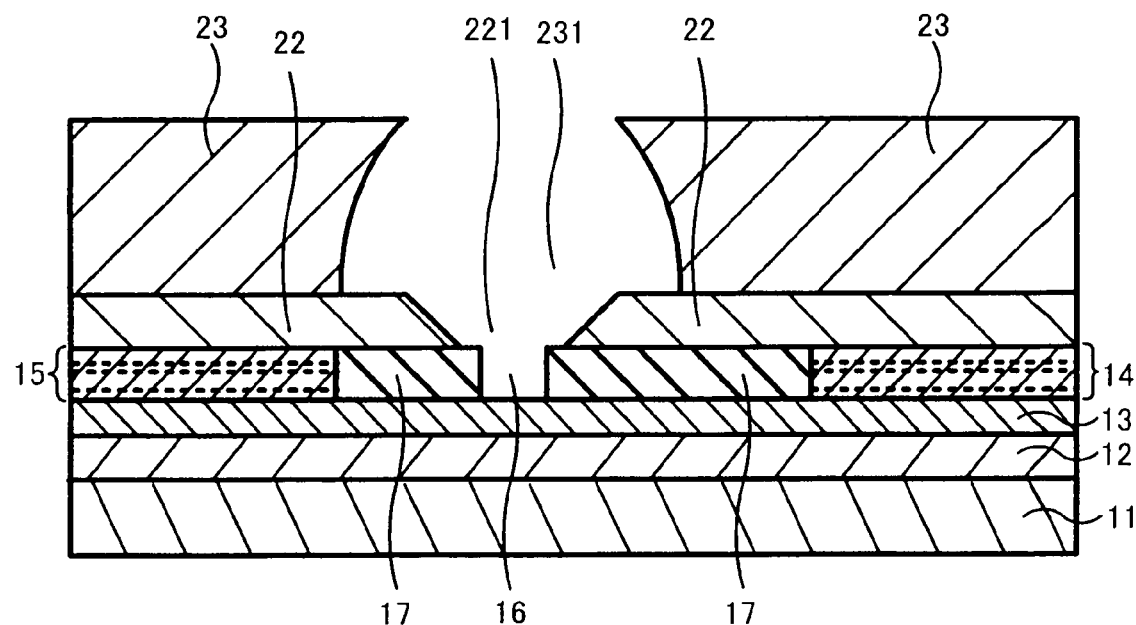
FIG. 6C is a sectional view illustrating a modified example of a manufacturing method for the semiconductor device illustrated in FIG. 6A.

The overhang-shaped third opening 231 does not necessarily have a staircase shape in cross section as illustrated in FIGS. 6A, 6B, but the sectional shape may be, for example, semicircular as illustrated in FIG. 6C.

The overhang-shaped third opening 231 of the second resist layer 23 formed in this way is formed above the tapered second opening 221.

Figure 7:
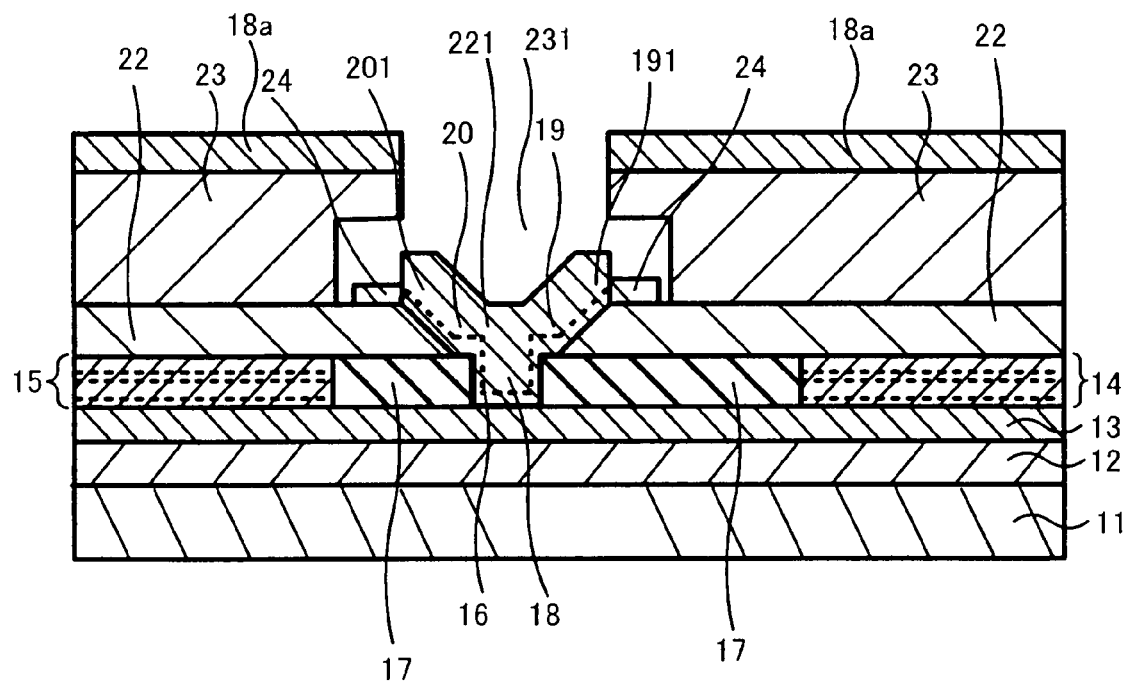
FIG. 7 is a sectional view illustrating a manufacturing process of a semiconductor device according to an embodiment of the present invention.

Subsequently, as illustrated in FIG. 7, Ni, Au which are electrode materials 18a of the gate electrode 18, the drain-side field plate electrode 19 and the source-side field plate electrode 20 are vapor-deposited over the whole surface in this order from above the second resist layer 23 to concurrently form the gate electrode 18, the drain-side field plate electrode 19 and the source-side field plate electrode 20. In this process, metal components diagonally incident to the overhang-shaped second opening 231 or a flow of deposited metal forms trailing portions 24 at the drain electrode 14 side end portion 191 of the source-side field plate electrode 19 and the source electrode 15 side end portion 201 of the source-side field plate electrode 20, as illustrated in FIG. 7.

The trailing portion 24 is mostly composed of Au, but Ni is also slightly contained therein.

Figure 8:
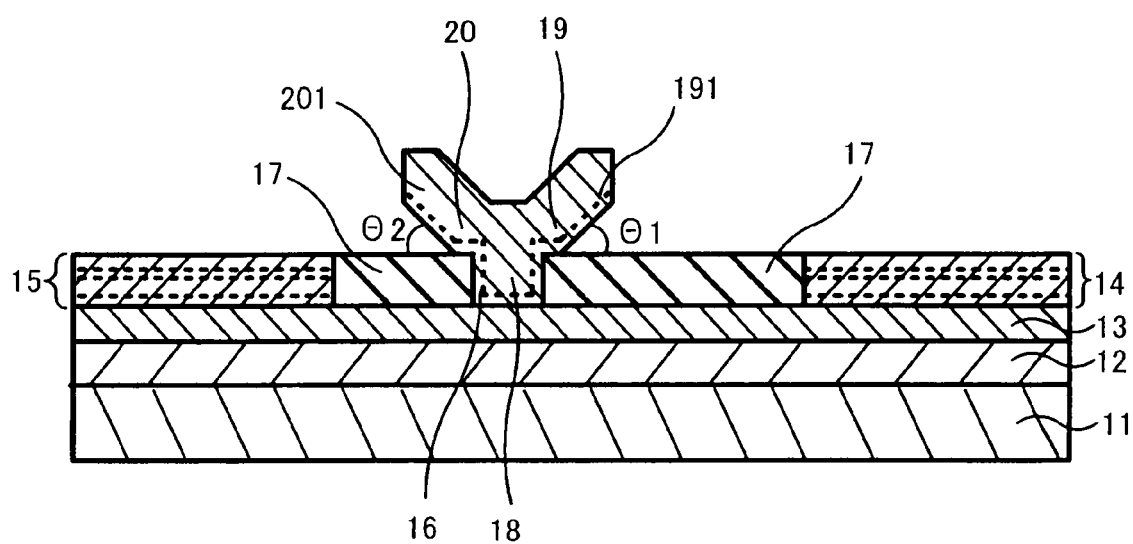
FIG. 8 is a sectional view illustrating a manufacturing process of a semiconductor device according to an embodiment of the present invention.

Finally, as illustrated in FIG. 8, the first resist layer 22 and the second resist layer 23 are removed. In this process, the trailing portions 24 illustrated in FIG. 7, which are formed on the first resist layer 22, are removed with the removal of the first resist layer 22 and the second resist layer 23.

As described above, after integrally forming the gate electrode 18, the drain-side field plate electrode 19 and the source-side field plate electrode 20, the surface protective film 21 is formed so as to cover surfaces thereof, thus completing the semiconductor device according to an embodiment of the present invention illustrated in FIGS. 1A and 1B.

The semiconductor device according to an embodiment of the present invention described above is structured such that the respective ends 191, 201 of the drain-side field plate electrode 19 and the source-side field plate electrode 20 are spaced from the insulation film 17 by use of the first and second resist layers 22, 23. As a result, each of the end portions 191, 201 has no trailing portion 24 extending therefrom. Accordingly, a distance between the end portion 191 of the drain-side field plate electrode 19 and the drain electrode 14 and a distance between the end portion 201 of the source-side field plate electrode 20 and the source electrode 15 can be restrained from being shortened, respectively. Accordingly, the floating capacitance between the end portion 191 of the drain-side field plate electrode 19 and the drain electrode 14 and the floating capacitance between the end portion 201 of the source-side field plate electrode 20 and the source electrode 15 can be suppressed from being increased.

It is therefore possible to provide a semiconductor device that suppresses degradation in the performance of the device.

An embodiment of the present invention has been described above. However, embodiments are not limited thereto.

Figure 9:
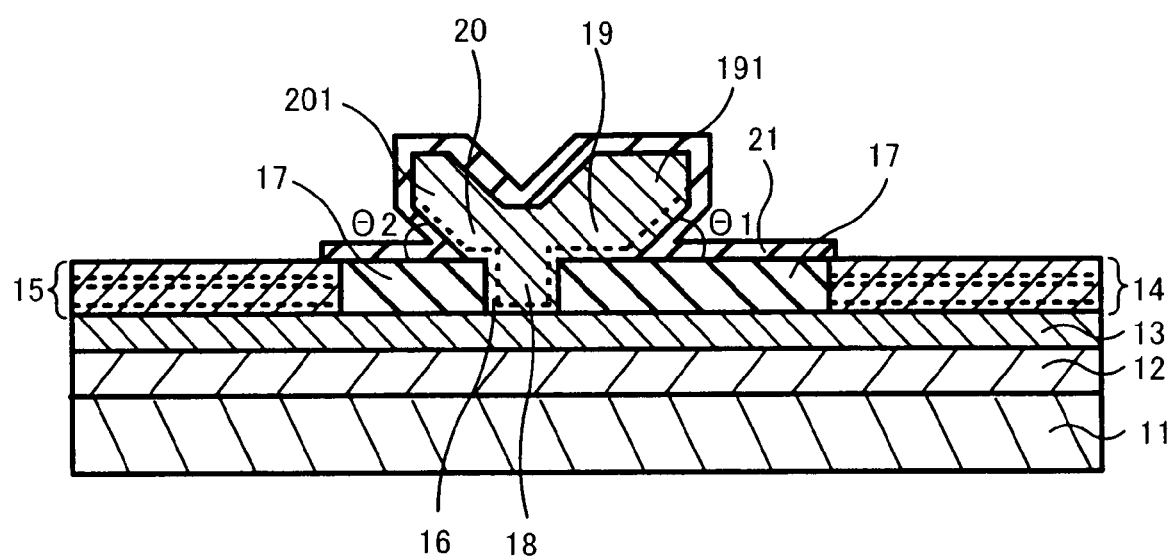
FIG. 9 is a sectional view illustrating a modified example of a semiconductor device according to an embodiment of the present invention.

For example, in the present embodiment, the drain-side field plate electrode 19 and the source-side field plate electrode are structured to have the same length. However, as illustrated in a sectional view of FIG. 9, the drain-side field plate electrode 19 may be formed to be longer than the source-side field plate electrode 20.

While the angles θ1, θ2 between the respective end portions 191, 201 of the drain-side field plate electrode 19 and the source-side field plate electrode 20 and the surface of the insulation film 17 are 60° in the present embodiment, the angles θ1, θ2 may be any angle more than 0° and 90° or less. However, because the distance between the end portion 191 of the drain-side field plate electrode 19 and the drain electrode 14 and the distance between the end portion 201 of the source-side field plate electrode 20 and the source electrode 15 can be made longer as the angles θ1, θ2 are larger, it is preferable that the angles θ1, θ2 are defined to be large values.

In the embodiment described above, description has been made on a GaN-based FET formed on a SiC substrate. However, the present invention is applicable to any form, provided that an FET can be formed.

What is claimed is:

1. A semiconductor device comprising:
    a semiconductor substrate;
    an operating layer formed on the semiconductor substrate;
    a source electrode and a drain electrode formed on the operating layer so as to be spaced from each other;
    an insulation film formed between the source electrode and the drain electrode and having a band-like opening in parallel to the source electrode and the drain electrode;
    a gate electrode formed at the opening in the insulation film; and
    a drain-side field plate electrode formed integrally with the gate electrode on the drain electrode side of the gate electrode, having a gate electrode side portion which is in contact with a surface of the insulation film and a drain electrode side end portion which is spaced from the surface of the insulation film.

2. The semiconductor device according to claim 1, further comprising a source-side field plate electrode formed integrally with the gate electrode on the source electrode side of the gate electrode, having a gate electrode side portion which is in contact with the surface of the insulation film and a source electrode side end portion which is spaced from the surface of the insulation film.

3. The semiconductor device according to claim 2, wherein an angle between the drain electrode side end portion and the surface of the insulation film and an angle between the source electrode side end portion and the surface of the insulation film are more than 0° and 90° or less, respectively.

4. The semiconductor device according to claim 3, wherein a length of the drain-side field plate electrode is larger than that of the source-side field plate electrode.

5. The semiconductor device according to claim 2, wherein a surface of the drain-side field plate electrode and a surface of the source-side field plate electrode are covered with a surface protective layer.

* * * * *